United States Patent
Li et al.

(10) Patent No.: US 8,330,634 B2
(45) Date of Patent: Dec. 11, 2012

(54) PRECISION SUB-RADIX$_2$ DAC WITH LINEARITY CALIBRATION

(75) Inventors: Yuanfang Li, Irvine, CA (US); David Castaneda, Morgan Hill, CA (US); Daniel Alexander, Chandler, AZ (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 134 days.

(21) Appl. No.: 13/023,093

(22) Filed: Feb. 8, 2011

(65) Prior Publication Data

US 2012/0200442 A1  Aug. 9, 2012

(51) Int. Cl.
 *H03M 1/78* (2006.01)
(52) U.S. Cl. .......................... 341/154; 341/144; 341/145
(58) Field of Classification Search .................. 341/144, 341/145, 154
See application file for complete search history.

(56) References Cited

U.S. PATENT DOCUMENTS

| 4,336,526 A |   | 6/1982  | Weir |
|---|---|---|---|
| 4,396,907 A | * | 8/1983  | Wintzer et al. ................. 341/127 |
| 4,843,394 A | * | 6/1989  | Linz et al. ...................... 341/154 |
| 4,970,514 A |   | 11/1990 | Draxelmayr |
| 5,977,898 A | * | 11/1999 | Ling et al. ...................... 341/144 |
| 6,154,121 A | * | 11/2000 | Cairns et al. ................... 341/138 |
| 6,380,877 B2 |   | 4/2002  | Castaneda et al. |
| 7,535,389 B1 |   | 5/2009  | Teterwak |

OTHER PUBLICATIONS

Ziya G. Boyacigiller, Basil Weir and Peter D. Bradshaw, Session VI: Acquisition Circuits; "An Error-Correcting 14b/20µs CMOS A/D Converter", Feb. 18, 1981, IEEE International Solid-State Circuits Conference; pp. 62-63.

* cited by examiner

*Primary Examiner* — Khai M Nguyen

(57) ABSTRACT

A system includes an N bit sub-binary radix digital-to-analog converter (DAC) that converts an m bit digital input signal to an analog output signal, where m and N are integers greater than or equal to 1 and N>m. A radix conversion module determines a code ratio, the code ratio being a ratio of a total number of available monotonic codes to $2^m$, and performs radix conversion on the m bit digital input signal based on the code ratio.

20 Claims, 8 Drawing Sheets

```
WL₀=1
for i=1 to NL
  WLᵢ=1
  Vout=0
  for j=i-1 down to 0
    if out+bⱼ<bᵢ then
      Vout=out+bⱼ
      WLᵢ=WLᵢ+WLⱼ
    end if
  end for
end for
```

```
for seg=0 to 2^NS-2
  WS_seg=1
  Vout=0
  if seg>0
    WS_seg=WS_seg+WS_seg-1
    Vout=out+seg_sum_seg-1
  end if
  for j=NL-1 down to 0
    if (out+bⱼ)<seg_sum_seg
      Vout=Vout+bⱼ
      WS_seg=WS_seg+WLⱼ
    end if
  end for
end for
```

PRECISION SUB-RADIX$_2$ DAC WITH LINEARITY CALIBRATION

FIELD

The present disclosure relates to a sub-radix$_2$ digital-to-analog converter (DAC).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital-to-analog converters (DACs) receive a digital input signal and convert the digital input signal into an analog output signal. The digital input signal has a range of digital codes that are converted into a continuous range of analog signal levels of the analog output signal. Accordingly, DACs are typically used to convert data between applications operating in digital and analog domains. For example only, applications of DACs include, but are not limited to, video display drivers, audio systems, digital signal processing, function generators, digital attenuators, data storage and transmission, precision instruments, and data acquisition systems.

A variety of types of DACs are available based upon desired functionality. For example only, DACs may have varying predetermined resolutions of the digital input signal, receive different encoded digital input signals, have different ranges of analog output signals using a fixed reference or a multiplied reference, and provide different types of analog output signals. Various DAC performance factors include, but are not limited to, settling time, full scale transition time, accuracy or linearity, and resolution.

A number of bits (i.e. a bit width) of the digital input signal defines the resolution, a number of output (quantization) levels, and a total number of digital codes that are acceptable for the DAC. For example, if the digital input signal is m-bits wide, the DAC has $2^m$ output levels.

In sub-binary radix (i.e. sub-radix$_2$) DACs, the ratio of a weighted DAC element to a next (lower) weighted DAC element is a constant less than 2 (i.e. sub-binary). For example only, the ratio may be approximately 1.85.

Referring now to FIG. 1, an example sub-binary radix DAC 10 includes a ladder module 12 having m ladder bits and a switch control module 14. For example only, the ladder module 12 is an R-βR ladder. The ladder module 12 receives analog reference signals 16 and 18. For example only, the analog reference signal 16 may be ground and the analog reference signal 18 may be a positive reference voltage. The switch control module 14 receives bits $b_0, b_1, \ldots, b_{m-1}$ of an m-bit binary digital input signal 20 and controls switches (not shown) of the ladder module 12 based on the m bits of the digital input signal 20. The ladder module 12 generates an analog output signal 22 based on the digital input signal 20 (i.e. the controlled switches of the ladder module 12) and the analog reference signals 16 and 18. Accordingly, the analog output signal 22 corresponds to the digital-to-analog conversion of the digital input signal 20.

Referring now to FIG. 2, the ladder module 12 of the DAC 10 is shown to include resistors $RL_0 \ldots RL_{m-1}$, referred to collectively as $RL_i$, and resistors $RDL_0 \ldots RDL_{m-1}$, referred to collectively as resistors $RDL_i$. Each of the resistors $RL_i$ has a value R and each of the resistors $RDL_i$ has a value βR. In other words, β corresponds to a ratio of an RDL resistor value to an RL resistor value. A termination resistor RT has a value of γR. The values of β and γ satisfy the equation $\gamma 2 = \beta + \gamma$. The radix of the DAC 10 corresponds to $$\frac{\gamma}{\gamma - 1}.$$

The analog reference signals 16 and 18 are selectively provided to the resistors RT and $RDL_i$ via switches 30.

The sub-binary radix DAC 10 is not monotonic. In other words, a transfer function of the DAC 10 is non-monotonic and a conversion between the non-monotonic transfer function and a monotonic transfer function is needed. Further, due to code overlapping, a dynamic range of the DAC 10 is reduced. Consequently, the DAC 10 uses additional bits to recover the dynamic range, and an algorithm is used to convert the bits of the m-bit binary digital input signal 20 to a sub-radix DAC code having additional bits. Conversion between the non-monotonic transfer function and the monotonic transfer function is performed via a calibration step and a radix conversion step.

The calibration step is performed using an example recursive successive approximation method. The method determines a last code having a smaller value than an analog bit weight of a current bit for each of the bits of the digital input signal 20 (from the LSB to the MSB). Results of the method are used to generate a calibration table that associates each bit i from 0 to m−1 with a corresponding digital weight $WL_i$. An example calibration table 50 for m=4 is shown in FIG. 3. The example calibration table 50 corresponds to the following design parameters: effective number of bits (i.e. bits of input DAC code)=3; radix DAC number of bits=4; and radix=1.5.

The radix conversion step is performed using an example successive subtraction method. The method performs successive subtraction of the digital weight $WL_i$ from the binary input value of the digital input signal 20 to determine which bits of the DAC 10 are set and which bits of the DAC 10 are cleared. Results of the method are used to generate a radix DAC code, and subsequently an output value, for each input DAC code. For example only, a code mapping table 70 as shown in FIG. 4 illustrates a relationship between input DAC codes from 000 to 111 and corresponding radix DAC codes and output values. The example code mapping table 70 corresponds to the following design parameters: effective number of bits=3; radix DAC number of bits=4; and radix=1.5.

SUMMARY

A system includes an N bit sub-binary radix digital-to-analog converter (DAC) that converts an m bit digital input signal to an analog output signal, where m and N are integers greater than or equal to 1 and N>m. A radix conversion module determines a code ratio, the code ratio being a ratio of a total number of available monotonic codes to $2^m$, and performs radix conversion on the m bit digital input signal based on the code ratio.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a calibration table for a sub-binary radix DAC according to the prior art;

FIG. 4 is a code mapping table of a sub-binary radix DAC according to the prior art;

DETAILED DESCRIPTION

Figure 1:
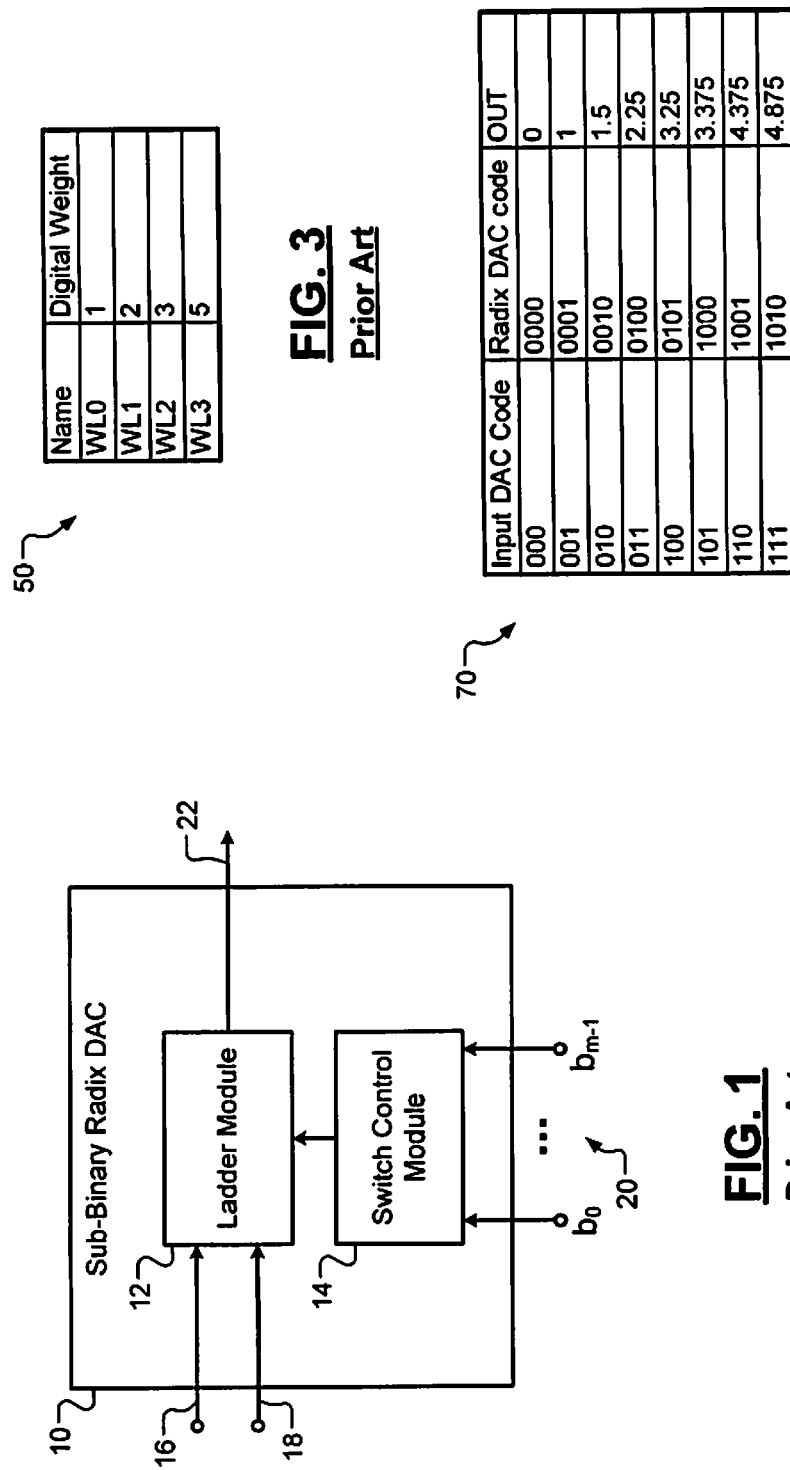
FIG. 1 is a functional block diagram of a sub-binary radix DAC according to the prior art.
Figure 2:
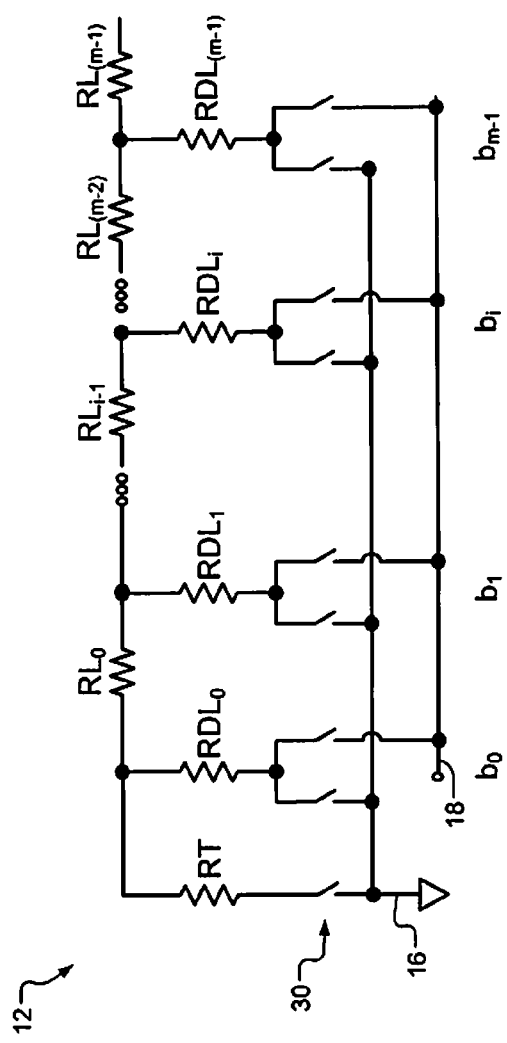
FIG. 2 is a schematic of a ladder module of a sub-binary radix DAC according to the prior art.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Figure 5:
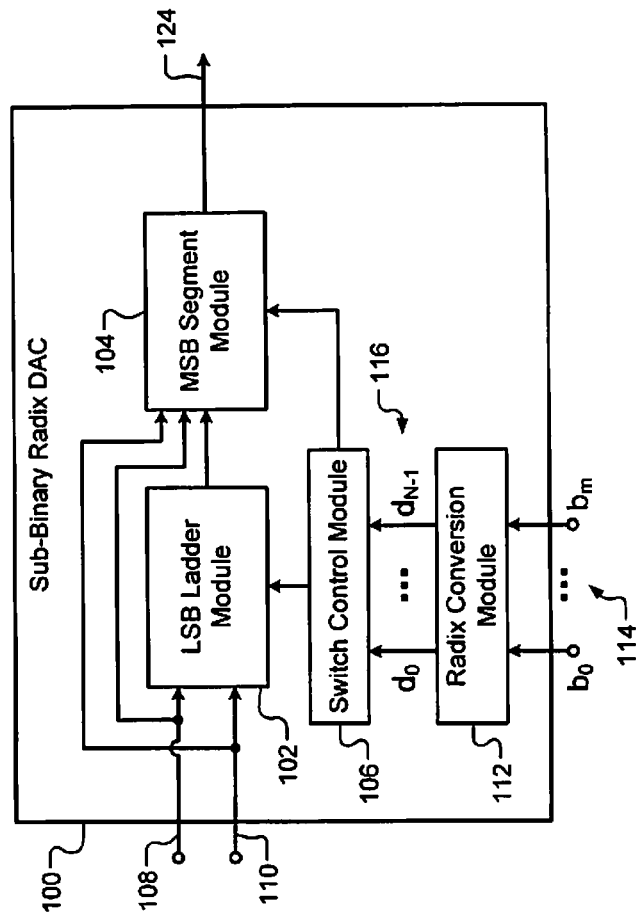
FIG. 5 is a functional block diagram of a sub-binary radix DAC according to the present disclosure.

Referring now to FIG. 5, a sub-binary radix DAC 100 according to the present disclosure includes an LSB ladder module 102, an MSB segment module 104, and a switch control module 106. For example only, the LSB ladder module 102 is an R-$\beta$R ladder. The LSB ladder module 102 and the MSB segment module 104 receive analog reference signals 108 and 110. For example only, the analog reference signal 108 may be ground and the analog reference signal 110 may be a positive reference voltage.

A radix conversion module 112 receives a binary digital input signal 114 and outputs an N bit switch control signal 116, where N (a number of radix DAC bits) corresponds to NL (a number of ladder bits)+NS (a number of segment bits). In other words, N=NL+NS. For example only, for an 18 bit DAC (i.e. for an 18 bit digital input signal), N is greater than 18. The value of NS (and therefore N) may be selected based on desired linearity or other performance parameters.

The switch control module 106 receives the N bits of the switch control signal 116 and controls switches (not shown) of the LSB ladder module 102 and the MSB segment module 104 based on the switch control signal 116. For example only, MSB segments of the MSB segment module 104 may be thermometer encoded. The MSB segment module 104 provides NS segment bits and generates an analog output signal 124 based on the controlled switches of the LSB ladder module 102 and the MSB segment module 104 and the analog reference signals 108 and 110. Accordingly, the analog output signal 124 corresponds to the digital-to-analog conversion of the digital input signal 114 after the radix conversion module 112 converts the digital input signal 114 to the N bit switch control signal 116.

Figures 6, 7, 8:
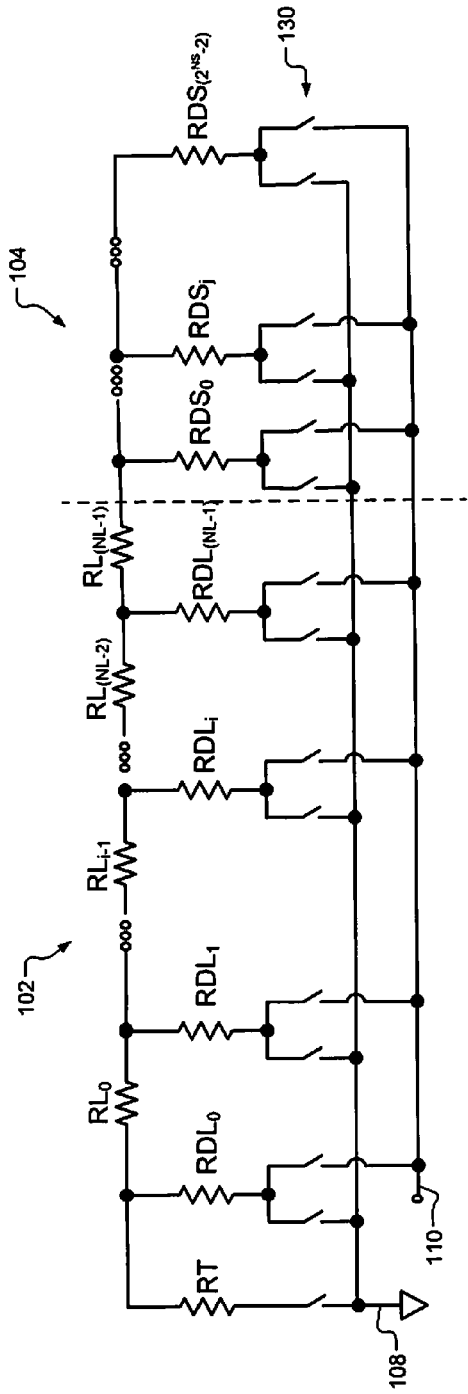
FIG. 6 is a schematic of a combination of a ladder module and an MSB segment module of a sub-binary radix DAC according to the present disclosure.
FIG. 7 illustrates a ladder calibration method using recursive successive approximation according to the present disclosure.
FIG. 8 illustrates a segment calibration method using recursive successive approximation according to the present disclosure.

Referring now to FIG. 6, the LSB ladder module 102 of the DAC 100 is shown to include resistors $RL_0 \ldots RL_{NL-1}$, referred to collectively as $RL_i$, resistors $RDL_0 \ldots RDL_{NL-1}$, referred to collectively as resistors $RDL_i$, and termination resistor RT. Each of the resistors $RL_i$ has a value R and each of the resistors $RDL_i$ has a value $\beta R$. The termination resistor RT has a value of $\gamma R$. The values of $\beta$ and $\gamma$ satisfy the equation $\beta 2=\beta+\gamma$. The MSB segment module 104 is shown to include resistors $RDS_0 \ldots RDS_{(2^{NS}-2)}$, referred to collectively as resistors $RDS_j$. Each of the resistors $RDS_j$ has a value $\beta R$. The analog reference signals 108 and 110 are selectively provided to the resistors RT, $RDL_i$, and $RDS_j$ via switches 130. The modified structure of the DAC 100 including the bits provided by the MSB segment module 104 improves resistance and drift sensitivities of the switch and metal connections of the DAC 100. Further, the MSB segment module 104 improves output noise of the DAC 100 without lowering DAC unit resistance.

Bits of the ladder module 102 and the segment module 104 are set or cleared using the switches 130. For example, a bit may be set when a corresponding one of the switches 130 connected to the analog reference signal 110 is closed. Conversely, a bit may be cleared when a corresponding one of the switches 130 connected to ground is closed.

Although the DAC 100 as described above implements a fixed radix for each bit, any of the techniques described herein may be applied to a mixed radix. For example only, a first number of bits associated with the LSB ladder module 102 may have a first radix (e.g. 2). Accordingly, a first number of stages of the LSB ladder module 102 associated with the first number of bits may operate as an R-2R DAC. For example only, the first number of bits may correspond to a number of stages that ensures monotonic output without any calibration. A remaining number of bits associated with the LSB ladder module 102 may have a different radix. The number of bits having the different radix may be determined based on, for example only, resistor matching and desired monotonic output.

An algorithm according to the present disclosure performs conversion between a non-monotonic transfer function of the DAC 100 and a monotonic transfer function via a calibration step and a radix conversion step. The calibration step includes an LSB ladder calibration step, an MSB segment calibration step, and a calculation of a good code ratio (e.g. a ratio based on a total number of monotonic codes). The radix conversion step converts the incoming digital code to a sub-radix DAC setting.

Referring now to FIG. 7, the LSB ladder calibration step is performed using, for example only, a recursive successive approximation method 150. The method 150 determines a last code having a smaller value than an analog bit weight of a current bit for each of the bits of the digital input signal 114. The method 150 calibrates each bit (for i from 1 to NL−1), starting from the LSB, of the digital input signal 114. In other words, the method 150 iteratively calibrates each bit i to determine a digital weight $WL_i$.

Referring now to FIG. 8, the MSB segment calibration step is performed using a segment calibration method 160. The method 160 asserts and calibrates each segment seg from the LSB segments to the MSB segments (from 0 to $2^{NS}-2$). When a current segment seg is asserted, segments 0 through seg are each turned on. A total number of monotonic codes below segment seg equals a sum of a total number of monotonic codes below segment seg−1 (or zero if seg=0) and a total number of monotonic codes between segment seg and segment seg−1 (or a zero code output if seg=0).

Figure 9:
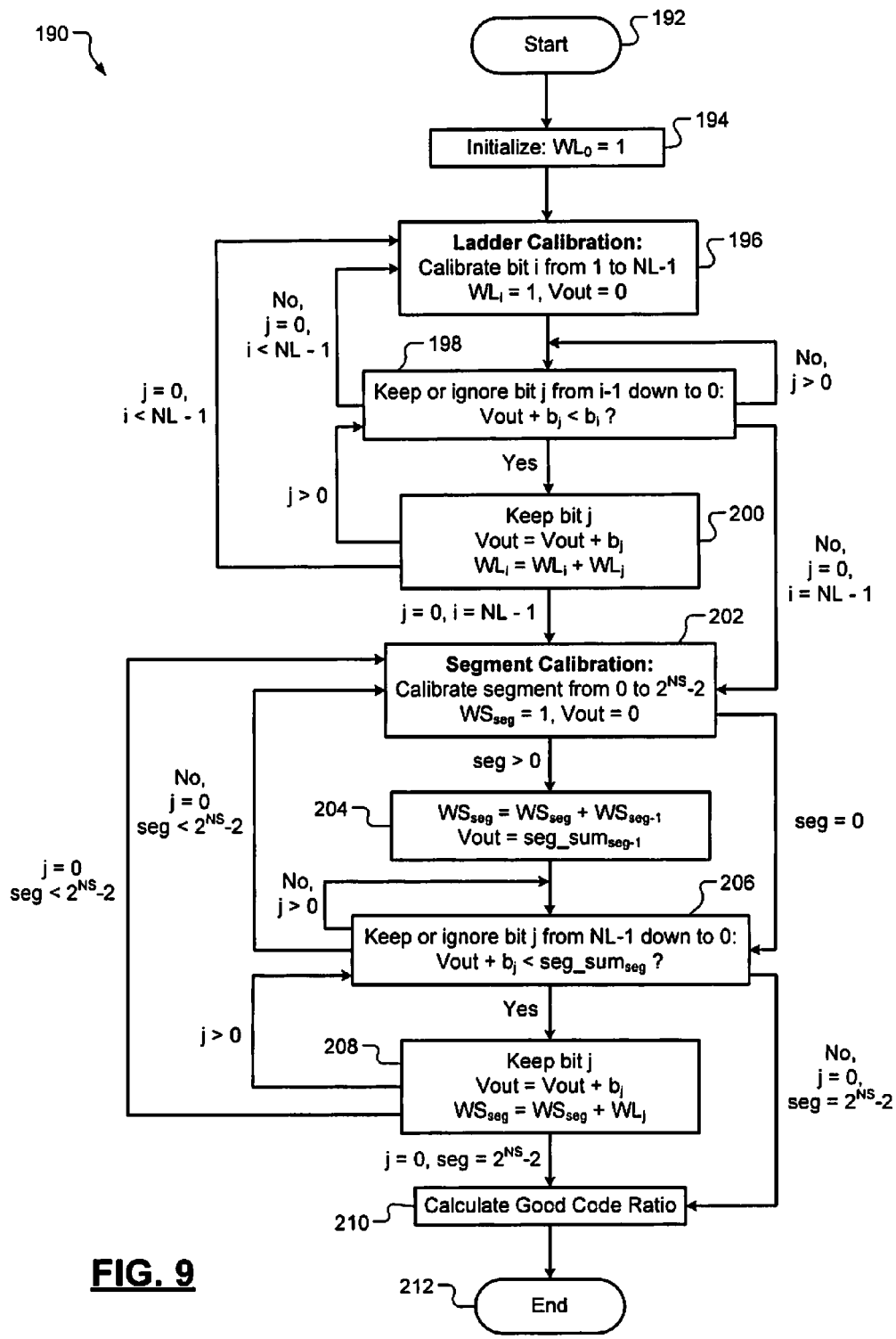
FIG. 9 is a flow diagram illustrating steps of the ladder calibration method and the segment calibration method according to the present disclosure.

Referring now to FIG. 9, the methods 150 and 160 are shown as a flow diagram 190 that begins in step 192. In step 194, $WL_0$ is set as 1. In other words, the digital weight of bit $b_0$ is set to 1. In step 196, ladder calibration begins in order to calibrate bit i from 1 to NL−1, and values of $WL_i$ and Vout are initialized to 1 and 0, respectively. The LSBs below bit i are then evaluated in step 198 to determine whether to keep or ignore each bit. Among the LSBs below bit i and starting from the MSB, j bits (from i−1 to 0) are iteratively evaluated. In step 198, control determines whether a sum of Vout and $b_j$ (i.e. an analog bit weight of a current bit j) is less than $b_i$. If true, control continues to step 200 to keep (i.e. set to 1) the current bit j. If false, control ignores (i.e. sets to 0) the current bit j. If false and j is greater than 0, control repeats step 198. If false, j=0, and i is less than NL−1, control continues to step 196. If false, j=0, and i=NL−1, control continues to step 202 to begin segment calibration.

In step 200, control keeps bit j, sets Vout equal to a sum of Vout and $b_j$, and sets $WL_i$ equal to a sum of $WL_i$ and $WL_j$, and determines whether all bits (from i−1 to 0 and from i+1 to NL−1) have been evaluated. If true (e.g. j=0 and i=NL−1), control continues to step 202 to begin segment calibration. If j is greater than 0, control returns to step 198. If j=0 and i is less than NL−1, control returns to step 196.

In step 202, segment calibration begins in order to calibrate each segment bit from 0 to $2^{NS}-2$, and values of $WS_{seg}$ and Vout are initialized to 1 and 0, respectively. If seg is greater than 0, control continues to step 204. If seg=0, control continues to step 206. In step 204, for seg greater than 0, a sum of $WS_{seg}$ and $WS_{seg-1}$ is stored as a new value for $WS_{seg}$, and an output (seg_sum$_{seg-1}$) when asserting segment seg−1 (i.e. when segments 0 through seg−1 are each turned on) is stored as a new value for Vout.

In steps 206 and 208, control determines whether to keep or ignore each bit of the ladder module 102 for j bits (for j from NL−1 to 0). In step 206, control determines whether a sum of Vout and an analog bit weight of a current bit j is less than seg_sum$_{seg}$. If true, control continues to step 208 to keep (i.e. set to i) the current bit j. If false, control ignores (i.e. sets to 0) the current bit j. If false, j=0, and seg=$2^{NS}-2$, control continues to step 210. If false and j is greater than 0, control repeats step 206. If false, j=0, and seg is less than $2^{NS}-2$, control returns to step 202.

In step 208, control keeps bit j, sets Vout equal to a sum of Vout and the analog bit weight of the current bit j and sets $WS_{seg}$ equal to a sum of $WS_{seg}$ and $WL_j$, and determines whether all bits (for j from NL−1 to 0) and all segments (i.e. through segment $2^{NS}-2$) have been evaluated. If true (e.g. j=0 and seg=$2^{NS}-2$) control continues to step 210. If false and j is greater than 0, control returns to step 206. If false, j=0, and seg is less than $2^{NS}-2$, control returns to step 202. In step 210, control calculates the good code ratio. For example only, control calculates the good code ratio according to $$\text{ratio} = \frac{\sum WL_i + WS_{2^{NS}-2} + 1}{2^M}.$$

Control ends calibration in step 212.

Figures 10, 11:
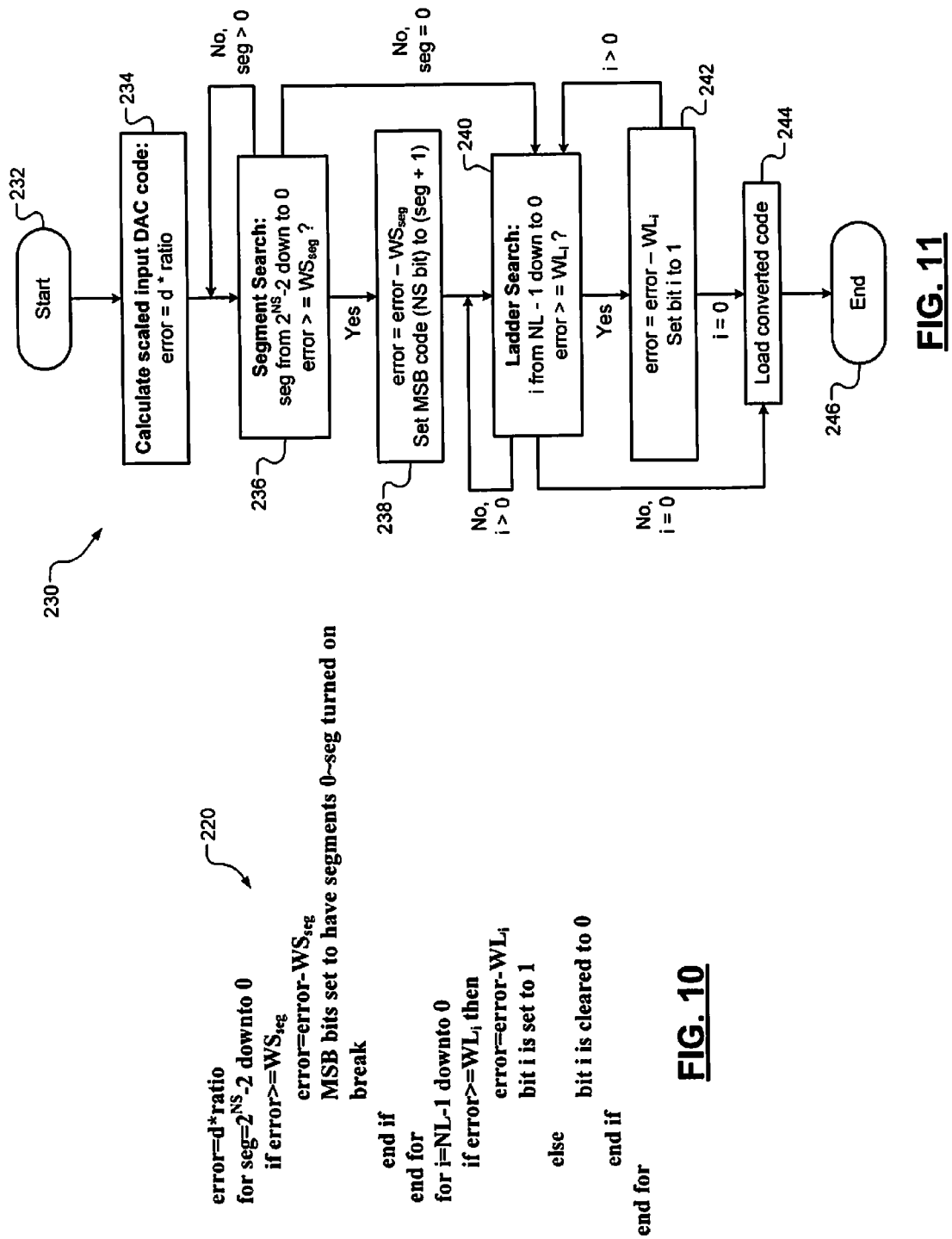
FIG. 10 illustrates a radix conversion method for performing a radix conversion step according to the present disclosure.
FIG. 11 is a flow diagram illustrating steps of the radix conversion method according to the present disclosure.

Referring now to FIG. 10, the radix conversion step is performed using a radix conversion method 220. The radix conversion method 220 determines which bits of the DAC 100 are kept (i.e. set to 1) and which bits are cleared or ignored (i.e. set to 0). The radix conversion method 220 according to the present disclosure calculates a total number of monotonic codes (code_total) and the good code ratio (code_ratio) based on the code_total and performs the radix conversion step based in part on the good code ratio. Incorporating the good code ratio into the radix conversion allows all available monotonic codes to be selected to form the DAC transfer function. Consequently, both differential non-linearity (DNL) and integral non-linearity (INL) performance are significantly improved.

Assuming an input DAC code (e.g. the digital input signal 114) is m bits and a sub-binary radix DAC (e.g. the DAC 100) is N bits (where N=NL+NS and N>m), an input DAC code is indicated by d. The code_total is calculated according to code_total=$\Sigma WL_i+WS_{2^{NS}-2}+1$. The code ratio corresponds to a ratio of the code_total to an m bit full code, or $$\frac{\text{code\_total}}{2^m}.$$

Referring now to FIG. 11, the method 220 is shown as a flow diagram 230 that begins in step 232. In step 234, control calculates a scaled input DAC code. For example, an "error" value is initialized to d*ratio (where "ratio" corresponds to the ratio of code_total to the m bit full code, and d is the m bit pre-scaled input DAC code).

In step 236, control begins a segment search. For example, starting from the MSB segment (for seg from $2^{NS}$-2 to 0), control finds a first segment having a total number of monotonic codes less than the scaled input code (error). If no segment meets this criterion, then no segments are turned on. Control determines whether error is greater than or equal to $WS_{seg}$. If true, control continues to step 238. If false and seg is greater than 0, control repeats step 236 for the next $WS_{seg}$. If false and seg=0, control continues to step 240 to begin a ladder search. In step 238, control sets a new value of the error to error−$WS_{seg}$ (for the first segment less than the error), and turns on segments 0 through seg of the MSB bits (i.e. sets MSB code (NS bit) to (seg+1)).

Control performs the ladder search for each bit, for i from NL−1 down to 0, in steps 240 and 242. In step 240, control determines whether error is greater than or equal to $WL_i$ of a current bit i. If true, control continues to step 242. If false, control ignores bit i (i.e. sets bit i to 0). If false and i is greater than 0, control repeats step 240. If false and i=0, control continues to step 244. In step 242, control sets a new value of error to error−$WL_i$ and keeps bit i (i.e. sets bit i to 1), and determines whether all bits (for i from NL−1 to 0) have been evaluated (i.e. i=0). If true, control continues to step 244. If false (i.e. i is greater than 0), control returns to step 240. In step 244, code conversion is completed and the converted code (e.g. a 22-bit code for NS=4 and NL=18) is stored. For example, control may load the code into a DAC register. Control ends radix conversion in step 246.

Figure 12:
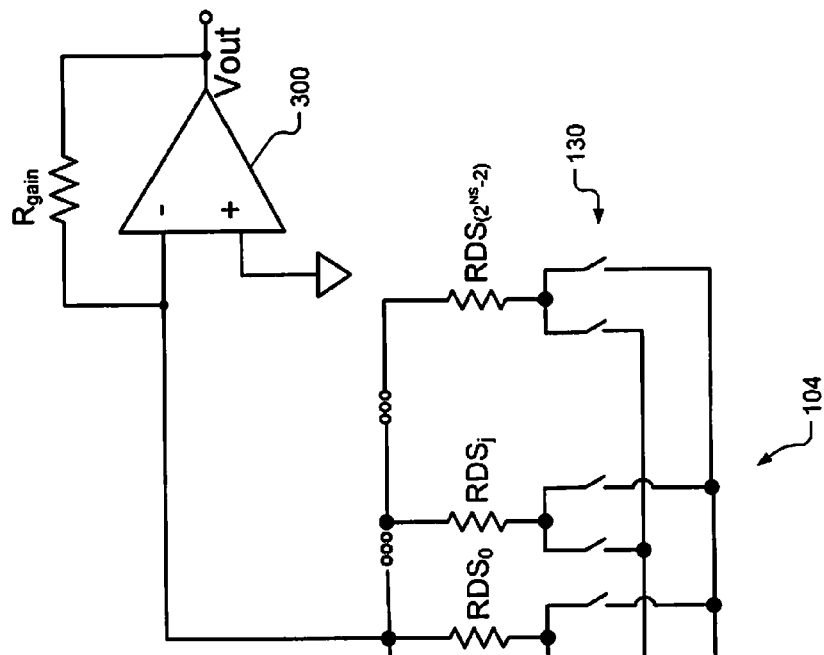
FIG. 12 is a code mapping table of a sub-binary radix DAC according to the present disclosure.

An example code mapping table 250 according to the present disclosure for input DAC codes from 000 to 111 and a code ratio of 1.5 is shown in FIG. 12. The example code mapping table 250 corresponds to the following design parameters: effective number of bits (i.e. bits of input DAC code)=3; radix DAC number of bits=4; and radix=1.5.

Figure 13:
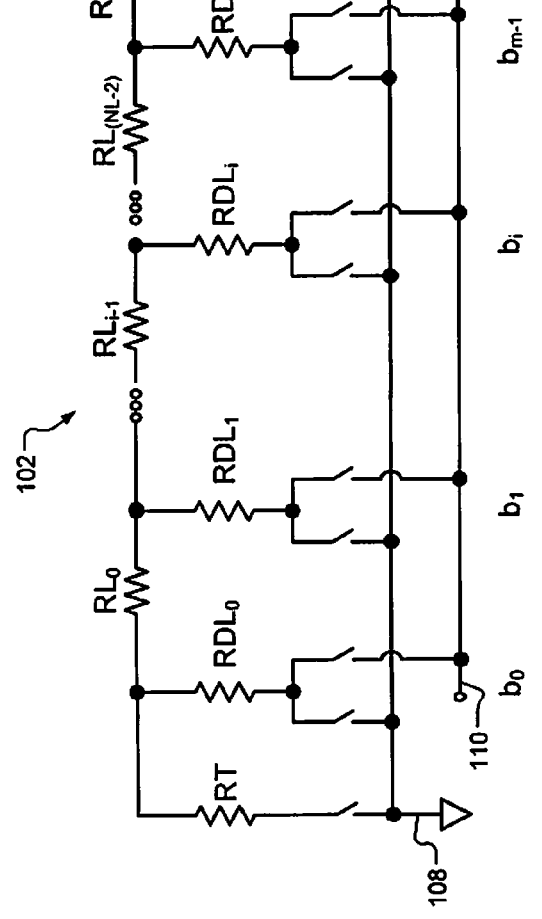
FIG. 13 is a schematic of a sub-binary radix DAC incorporating gain trim according to the present disclosure.

Referring now to FIG. 13, the incorporation of the code ratio into the radix conversion method 220 allows a desired gain trim to be achieved without an additional analog or digital trim network. In particular, the code ratio may be adjusted to achieve a high resolution gain trim. For example only, the DAC 100 may include an inverting output amplifier 300 and a resistor $R_{gain}$ connected to the resistor $RDS_0$ of the MSB segment module 104. When a value of $R_{gain}$ is larger than a nominal DAC output resistance RDAC, a positive initial gain error is introduced to the DAC 100. Accordingly, the code ratio can be adjusted downward to achieve the desired gain trim. For example only, the code ratio can be calculated according to $$\text{code\_ratio} = \frac{\text{code\_total}}{2^M} * \frac{RDAC}{R_{gain}}.$$

Figure 14A:
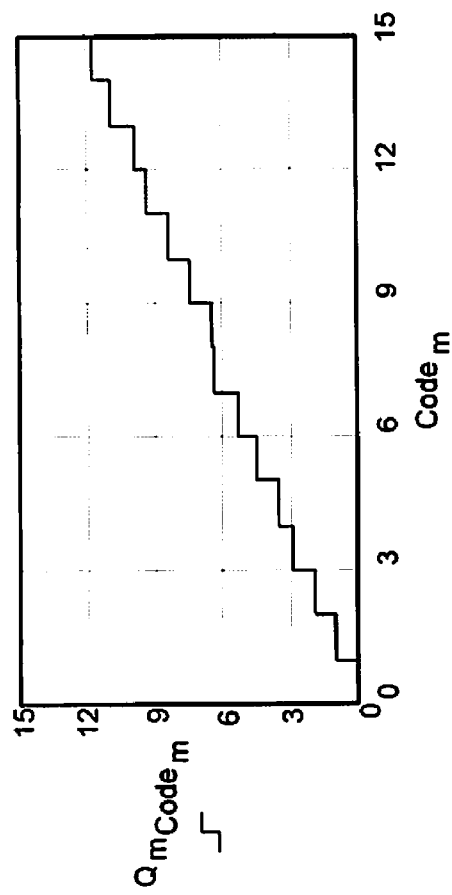
FIG. 14A illustrates DAC output after calibration according to the prior art.
Figure 14B:
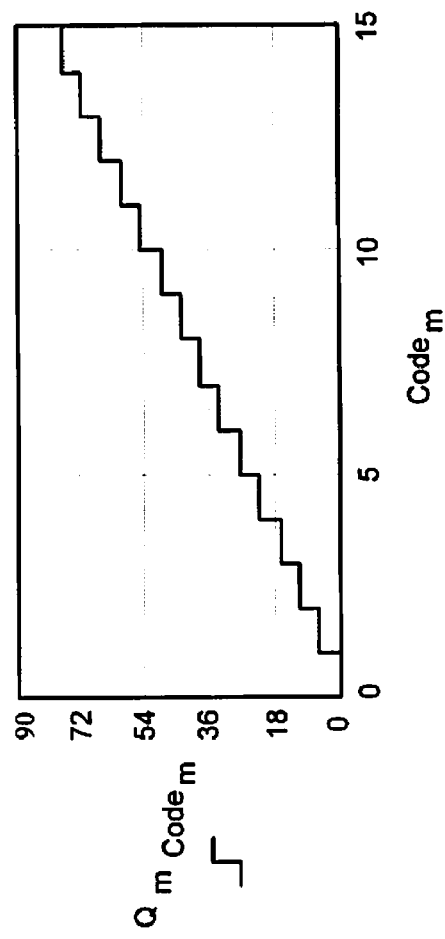
FIG. 14B illustrates DAC output after calibration according to the present disclosure.
Figure 16A:
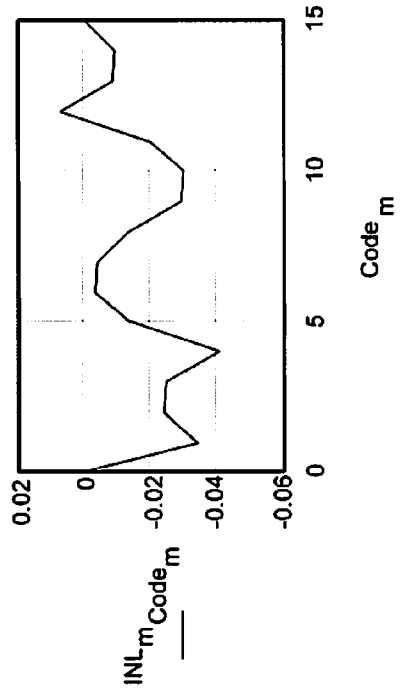
FIG. 16A illustrates INL after calibration according to the prior art.
Figure 16B:
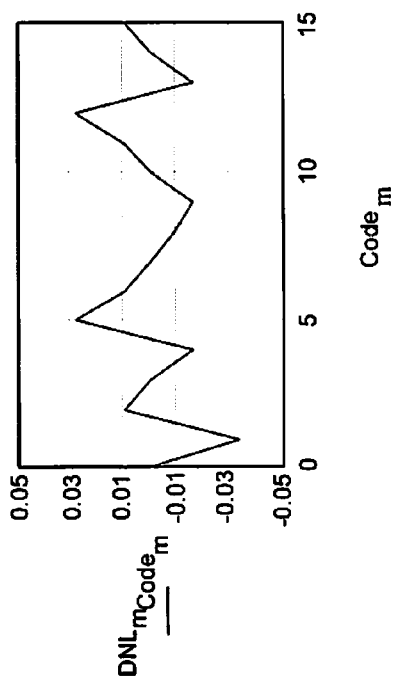
FIG. 16B illustrates INL after calibration according to the present disclosure.
Figure 15A:
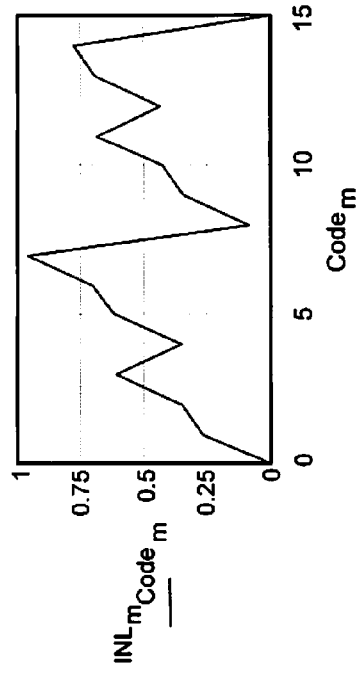
FIG. 15A illustrates DNL after calibration according to the prior art.
Figure 15B:
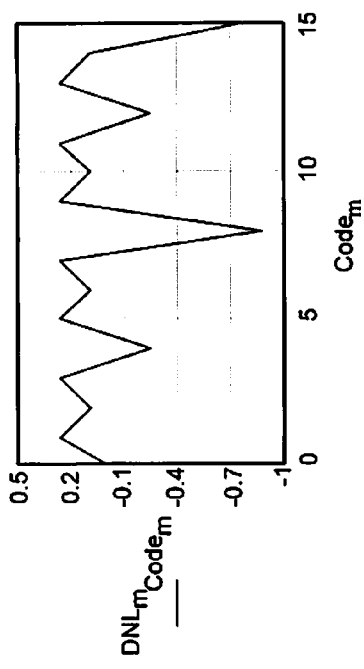
FIG. 15B illustrates DNL after calibration according to the present disclosure.

Referring now to FIGS. 14A and 14B, DAC output after calibration is shown for a conventional DAC and the DAC 100 according to the present disclosure, respectively. Referring now to FIGS. 15A and 15B, DNL after calibration is shown for a conventional DAC and the DAC 100 according to the present disclosure, respectively. Referring now to FIGS. 16A and 16B, INL after calibration is shown for a conventional DAC and the DAC 100 according to the present disclosure, respectively. For each of FIGS. 14A, 14B, 15A, 15B, 16A, and 16B, the following design parameters are assumed: effective number of bits=4; radix DAC number of bits=7; and radix=1.857.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
    an N bit sub-binary radix digital-to-analog converter (DAC) that converts an m bit digital input signal to an analog output signal, where m and N are integers greater than or equal to 1 and N>m; and
    a radix conversion module that determines a code ratio, the code ratio being a ratio of a total number of available monotonic codes to $2^m$, and that performs radix conversion on the m bit digital input signal based on the code ratio.

2. The system of claim 1 wherein the radix conversion includes converting the m bit digital input signal to an N bit sub-radix DAC code.

3. The system of claim 1 wherein the radix conversion includes multiplying the digital input signal by the code ratio.

4. The system of claim 1 wherein the radix conversion module adjusts the code ratio to achieve a desired gain trim.

5. The system of claim 4 further comprising:
    an amplifier coupled to the DAC; and
    a gain resistor coupled to the amplifier and the DAC,
        wherein the radix conversion module adjusts the code ratio based on a resistance $R_{gain}$ of the gain resistor.

6. The system of claim 5 wherein the radix conversion module adjusts the code ratio further based on a DAC output resistance RDAC that is less than $R_{gain}$.

7. The system of claim 6 wherein the radix conversion module adjusts the code ratio by multiplying the code ratio by $$\frac{RDAC}{R_{gain}}.$$

8. The system of claim 1 wherein the DAC includes:
    an NL bit ladder module having NL ladder resistors connected in parallel; and
    an NS bit segment module having $2^{NS}$-1 segment resistors connected in parallel, where NS is an integer greater than or equal to 1.

9. The system of claim 8 wherein a first number of the NL bits are associated with a first radix and a second number of the NL bits are associated with a second radix that is different than the first radix.

10. The system of claim 8 wherein the radix conversion includes selectively setting and clearing bits of the NL bit ladder module and the NS bit segment module based on the code ratio.

11. A method comprising:
    converting an m bit digital input signal to an analog output signal using an N bit sub-binary radix digital-to-analog converter (DAC), where m and N are integers greater than or equal to 1 and N>m;

determining a code ratio, the code ratio being a ratio of a total number of available monotonic codes to $2^m$; and performing radix conversion on the m bit digital input signal based on the code ratio.

12. The method of claim 11 further comprising converting the m bit digital input signal to an N bit sub-radix DAC code.

13. The method of claim 11 further comprising multiplying the digital input signal by the code ratio.

14. The method of claim 11 further comprising adjusting the code ratio to achieve a desired gain trim.

15. The method of claim 14 further comprising:
coupling an amplifier to the DAC;
coupling a gain resistor to the amplifier and the DAC; and
adjusting the code ratio based on a resistance $R_{gain}$ of the gain resistor.

16. The method of claim 15 further comprising adjusting the code ratio further based on a DAC output resistance RDAC that is less than $R_{gain}$.

17. The method of claim 16 further comprising adjusting the code ratio by multiplying the code ratio by $$\frac{RDAC}{R_{gain}}.$$

18. The method of claim 11 wherein the DAC includes:
an NL bit ladder module having NL ladder resistors connected in parallel; and
an NS bit segment module having $2^{NS}-1$ segment resistors connected in parallel, where NS is an integer greater than or equal to 1.

19. The method of claim 18 wherein a first number of the NL bits are associated with a first radix and a second number of the NL bits are associated with a second radix that is different than the first radix.

20. The method of claim 18 further comprising selectively setting and clearing bits of the NL bit ladder module and the NS bit segment module based on the code ratio.

* * * * *

UNITED STATES PATENT AND TRADEMARK OFFICE
CERTIFICATE OF CORRECTION

PATENT NO. : 8,330,634 B2
APPLICATION NO. : 13/023093
DATED : December 11, 2012
INVENTOR(S) : Li et al.

It is certified that error appears in the above-identified patent and that said Letters Patent is hereby corrected as shown below:

In the Specification

Column 4, Line 62     Delete "$\beta 2 = \beta + \gamma$" and insert --$\gamma 2 = \beta + \gamma$--

Signed and Sealed this
First Day of October, 2013

Teresa Stanek Rea
*Deputy Director of the United States Patent and Trademark Office*